(12) United States Patent
Liu

(10) Patent No.: US 11,809,232 B2
(45) Date of Patent: Nov. 7, 2023

(54) DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yali Liu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 589 days.

(21) Appl. No.: 16/971,911

(22) PCT Filed: Jul. 21, 2020

(86) PCT No.: PCT/CN2020/103262
§ 371 (c)(1),
(2) Date: Aug. 21, 2020

(87) PCT Pub. No.: WO2022/000613
PCT Pub. Date: Jan. 6, 2022

(65) Prior Publication Data
US 2023/0129007 A1 Apr. 27, 2023

(30) Foreign Application Priority Data
Jul. 1, 2020 (CN) .......................... 202010625255.2

(51) Int. Cl.
*G06F 1/16* (2006.01)

(52) U.S. Cl.
CPC .................................. *G06F 1/1652* (2013.01)

(58) Field of Classification Search
CPC .... G06F 1/1616; G06F 1/1618; G06F 1/1641; G06F 1/1626; G06F 1/1652
See application file for complete search history.

(56) References Cited

U.S. PATENT DOCUMENTS

| | | | |
|---|---|---|---|
| 9,627,637 B2 | 4/2017 | Kwon | |
| 11,089,696 B2* | 8/2021 | Horiuchi | ............... G06F 1/1616 |
| 2016/0209874 A1 | 7/2016 | Choi et al. | |
| 2017/0061836 A1* | 3/2017 | Kim | ...................... G06F 1/1626 |
| 2017/0196078 A1* | 7/2017 | Choi | ...................... G06F 1/1641 |
| 2018/0093462 A1 | 4/2018 | Liu et al. | |

(Continued)

FOREIGN PATENT DOCUMENTS

| | | |
|---|---|---|
| CN | 105702170 A | 6/2016 |
| CN | 106530973 A | 3/2017 |

(Continued)

*Primary Examiner* — Sagar Shrestha

(57) ABSTRACT

A display device is provided. The display device includes a flexible display panel including at least one bending area and at least two non-bending areas, at least one support layer, and at least one glue layer, wherein the glue layer is disposed between the support layer and the flexible display panel. Through a plurality of methods to bond the panel and the support layer in the bending area of a display screen and a theoretical calculation formula for a reasonable spacing without glue, the present disclosure can allow the display screen to receive less constraints from mechanisms.

14 Claims, 2 Drawing Sheets

(56) References Cited

U.S. PATENT DOCUMENTS

| | | | |
|---|---|---|---|
| 2019/0391615 A1* | 12/2019 | Kee | G06F 1/1641 |
| 2020/0061972 A1* | 2/2020 | Ha | B32B 37/185 |
| 2020/0234616 A1* | 7/2020 | Ha | G06F 1/1652 |
| 2020/0389986 A1* | 12/2020 | Tsuchihashi | G06F 1/1616 |
| 2021/0068270 A1* | 3/2021 | Zhou | G06F 1/1681 |
| 2021/0191468 A1* | 6/2021 | Nakamura | H10K 50/00 |
| 2021/0217975 A1* | 7/2021 | Gu | G09F 9/30 |
| 2021/0383728 A1* | 12/2021 | Zhao | B32B 37/12 |
| 2021/0408445 A1* | 12/2021 | Sim | H10K 50/84 |
| 2022/0132679 A1* | 4/2022 | Han | G06F 1/1681 |
| 2022/0167509 A1* | 5/2022 | Wu | G02F 1/133305 |
| 2022/0199923 A1* | 6/2022 | Yamane | B32B 15/09 |
| 2022/0374058 A1* | 11/2022 | Kim | G06F 1/1686 |

FOREIGN PATENT DOCUMENTS

| | | |
|---|---|---|
| CN | 106652802 A | 5/2017 |
| CN | 107025851 A | 8/2017 |
| CN | 108766247 A | 11/2018 |
| CN | 109377887 A | 2/2019 |
| CN | 110189638 A | 8/2019 |
| CN | 210296381 U | 4/2020 |
| CN | 210836904 U | 6/2020 |
| CN | 112242094 A | 1/2021 |

\* cited by examiner

DISPLAY DEVICE

FIELD OF INVENTION

The present disclosure relates to the field of display technologies, and more particularly, to a display device.

BACKGROUND OF INVENTION

With development of display technologies, in order to satisfy different usage requirements, a variety of display products with different characteristics have also emerged. A development trend of intelligence, portability, and flexibility is one of the main development directions of current electronic devices. A most prominent advantage of flexible display devices compared to conventional tablet displays is that the flexible display devices break through inherent concepts of original two-dimensional displays and expand application fields of displays to more portable devices. The flexible display devices are new display products having flexibility. When in use, users can fold or roll the flexible display devices according to needs to reduce sizes of the display devices, thereby improving portability of the display devices, or can also expand foldable display devices to obtain a larger display image. At present, performance improvement of flexible display devices has become a focus of researchers. Foldable displays, as a development direction of a new generation of flexible display technologies, have received widespread attention in the industry. However, most important problems and difficulties lie in that the flexible display devices are relatively light and thin and have poorer overall bending resistances and impact resistances, so long-term bending will cause the flexible display devices to have large local deformation, which may result in denaturation of polymer materials in the flexible display devices, thereby causing phenomena such as "creases" and "white lines" in bending areas and causing the flexible display devices to lose effectiveness.

At present, foldable display screens easily have wrinkling phenomena such as "creases" and "white lines" during repeated bending and flattening. In addition to improving materials' own characteristics, at present, screen manufacturers mainly use ultra thin amorphous materials or metals to attach to a bottom of panels to ensure bending performances while improving overall stiffness with the amorphous materials or metals when bending. Improved stiffness can greatly reduce undulation heights of "creases" and "white lines". However, in practical applications, in order to prevent display areas in the bending areas from receiving excess squeezes by mechanisms when folding, thereby producing defective products, the panels are rarely fully attached to the metals when actually attached. If a distance without glue is too short, pulling forces will be caused on the panels, and the panels easily have abnormal display after repeated bending. If the distance without glue is too long, during repeated bending, big "creases" and "waves" will be generated. Therefore, a reasonable distance without glue and attaching methods can improve comprehensive performance of foldable screens.

Technical problem: in order to overcome shortcomings of current technology, through a plurality of methods to bond a panel and a support layer in a bending area of a display screen and a theoretical calculation formula for a reasonable spacing without glue, an embodiment of the present disclosure can allow the display screen to receive less constraints from mechanisms and relieve phenomena such as "creases" and "waves" of the display screen when flattening the panel.

SUMMARY OF INVENTION

An embodiment of the present disclosure provides technical solutions as follows.

An embodiment of the present disclosure provides a display device. The display device includes:

a flexible display panel comprising a display surface, a non-display surface disposed opposite to the display surface, at least one bending area, and at least two non-bending areas, wherein the bending area and the non-bending areas are arranged along a same direction, and the bending area is positioned between two of the non-bending areas adjacent to each other;

at least one support layer disposed on the non-display surface of the flexible display panel; and at least one glue layer disposed between the support layer and the flexible display panel to bond the support layer and the flexible display panel;

wherein when the display device is folded, the bending area is drop-shaped or U-shaped; and the support layer comprises amorphous materials or stainless steel materials, and a thickness of the support layer is less than or equal to 200 micrometers.

According to the display device provided by the embodiment of the present disclosure, the support layer and the flexible display panel have a same size.

According to the display device provided by the embodiment of the present disclosure, in the non-bending areas, the support layer is completely attached to the flexible display panel by the glue layer, and in the bending area, the support layer is not attached to the flexible display panel and is positioned in a hollowed-out area of the bending area.

According to the display device provided by the embodiment of the present disclosure, a spacing L without attaching the glue layer in the bending area is:

$$L=-1.35+4.85R1+0.193R2;$$

wherein R1 is a lateral radius of the flexible display panel in the bending area after the display device is bent, and R2 is a longitudinal radius of the flexible display panel in the bending area after the display device is bent.

According to the display device provided by the embodiment of the present disclosure, the support layer comprises a plurality of segments, and the support layer comprises a plurality of hard support layers and a soft support layer.

According to the display device provided by the embodiment of the present disclosure, in the non-bending areas, the hard support layers are attached to the flexible display panel, and in the bending area, the soft support layer is attached to the flexible display panel.

According to the display device provided by the embodiment of the present disclosure, the soft support layer comprises silica gel or silicone rubber, and a viscosity of the soft support layer ranges from 400,000 centipoise to 700,000 centipoise.

According to the display device provided by the embodiment of the present disclosure, thicknesses of the soft support layer and the hard support layers are same.

An embodiment of the present disclosure further provides a display device. The display device includes:

a flexible display panel comprising a display surface, a non-display surface disposed opposite to the display surface, at least one bending area, and at least two non-bending areas, wherein the bending area and the non-bending areas are arranged along a same direction, and the bending area is positioned between two of the non-bending areas adjacent to each other;

at least one support layer disposed on the non-display surface of the flexible display panel; and at least one glue layer disposed between the support layer and the flexible display panel to bond the support layer and the flexible display panel;

wherein when the display device is folded, the bending area is drop-shaped or U-shaped.

According to the display device provided by the embodiment of the present disclosure, the support layer comprises amorphous materials or stainless steel materials.

According to the display device provided by the embodiment of the present disclosure, a thickness of the support layer is less than or equal to 200 micrometers.

According to the display device provided by an embodiment of the present disclosure, the support layer and the flexible display panel have a same size.

According to the display device provided by an embodiment of the present disclosure, in the non-bending areas, the support layer is completely attached to the flexible display panel by the glue layer, and in the bending area, the support layer is not attached to the flexible display panel and is positioned in a hollowed-out area of the bending area.

According to the display device provided by the embodiment of the present disclosure, a spacing L without attaching the glue layer in the bending area is:

$$L = -1.35 + 4.85R1 + 0.193R2;$$

wherein R1 is a lateral radius of the flexible display panel in the bending area after the display device is bent, and R2 is a longitudinal radius of the flexible display panel in the bending area after the display device is bent.

According to the display device provided by the embodiment of the present disclosure, the support layer comprises a plurality of segments, and the support layer comprises a plurality of hard support layers and a soft support layer.

According to the display device provided by the embodiment of the present disclosure, in the non-bending areas, the hard support layers are attached to the flexible display panel, and in the bending area, the soft support layer is attached to the flexible display panel.

According to the display device provided by the embodiment of the present disclosure, the soft support layer comprises silica gel or silicone rubber, and a viscosity of the soft support layer ranges from 400,000 centipoise to 700,000 centipoise.

According to the display device provided by the embodiment of the present disclosure, thicknesses of the soft support layer and the hard support layers are same.

Beneficial effect: the display device provided by an embodiment of the present disclosure hollows out a glue layer in a bending area, that is, a support layer in the bending area is not attached to a flexible display panel, and because there is no glue layer in the bending area, when the display device is bent, the bending area is not restricted by mechanisms and can be easily bent; and when the display device is unfolded, there are no "crease" and "wave" caused by deformation of the glue layer. A segmented support layer structure is further provided, which uses a soft support layer in the bending area. When the display device is bent, the soft support layer can reduce stresses from non-bending areas and the deformation of the glue layer. The soft support layer is resistant to bending and can also keep the display device in a drop-shape or a U-shape after being folded. When the display device is unfolded, the soft support layer has good flatness, thereby reducing phenomena such as "creases" and "waves". Therefore, the display device provided by the embodiment of the present disclosure can improve the flatness of the glue layer after multiple repeated folding operations and then being restored to an unfolded state, and ensures adhesion between the glue layer and a functional layer attached to the glue layer, thereby preventing the display device from having problems of degumming, "creases", and "waves".

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
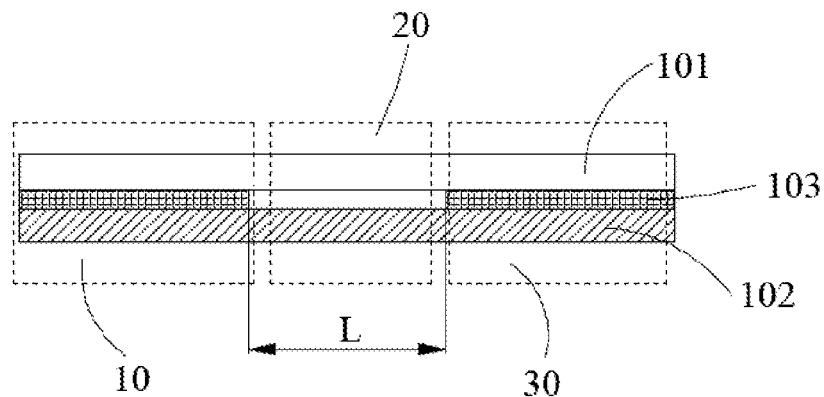
FIG. 1 is a schematic structural diagram one of a display device according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In the description of the present disclosure, it should be understood that terms such as "center", "longitudinal", "lateral", "length", "width", "thickness", "upper", "lower", "front", "rear", "left", "right", "vertical", "horizontal", "top", "bottom", "inside", "outside", "clockwise", "counterclockwise", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The following description provides many different embodiments or examples for implementing different structures of the present disclosure. In order to simplify the present disclosure, the components and settings of a specific example are described below. Of course, they are merely examples and are not intended to limit the present disclosure. In addition, the present disclosure may repeat reference numerals and/or reference letters in different examples, which are for the purpose of simplicity and clarity, and do not indicate the relationship between the various embodiments and/or arrangements discussed. In addition, the present disclosure provides examples of various specific processes and materials, but one of ordinary skill in the art will recognize the use of other processes and/or the use of other materials.

Figure 2A:
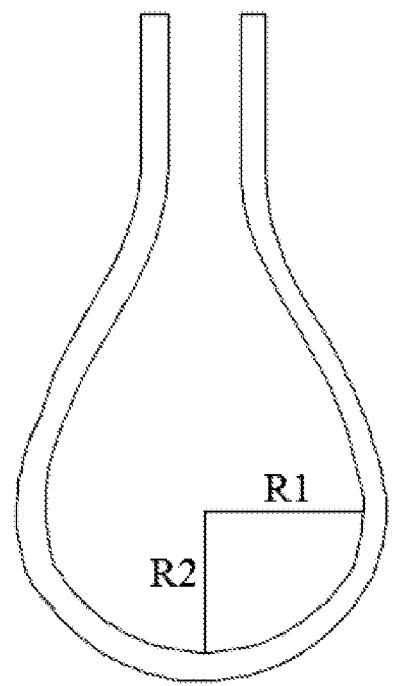
FIG. 2A is a schematic structural diagram one of the display device being bent according to an embodiment of the present disclosure.
Figure 2B:
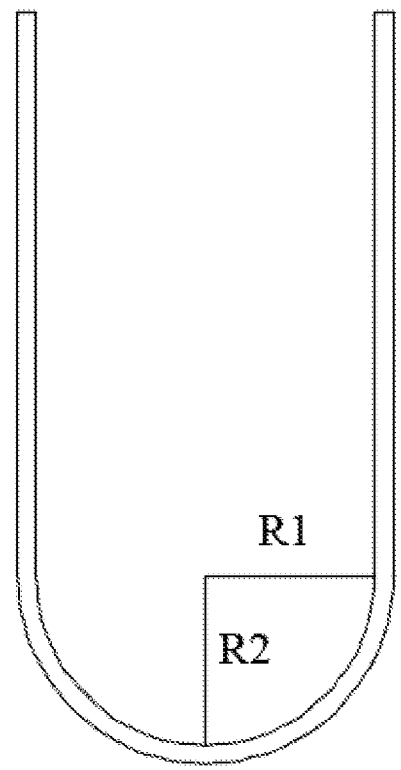
FIG. 2B is a schematic structural diagram two of the display device being bent according to an embodiment of the present disclosure.
Figure 3:
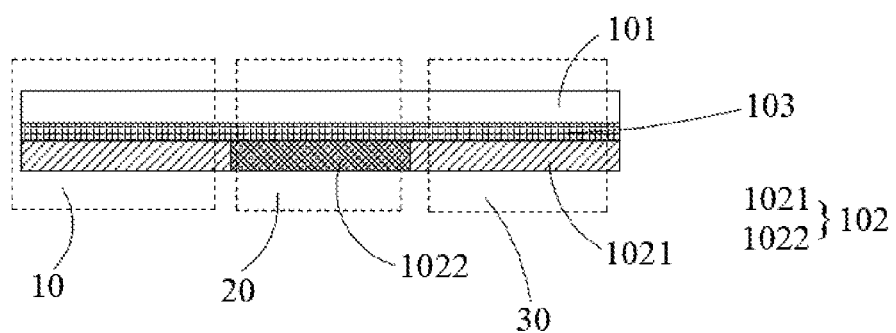
FIG. 3 is a schematic structural diagram two of the display device according to an embodiment of the present disclosure.

An embodiment of the present disclosure provides a display device. The display device may be an organic light-emitting diode (OLED) display device having a top-emitting structure or other flexible display devices, which is not limited by the present disclosure. A flexible display device is taken as an example for description by the embodiment of the present disclosure. As shown in FIGS. 1 to 3, the display device provided by the present disclosure includes: a flexible display panel 101 including a display surface, a non-display surface disposed opposite to the display surface, at least one bending area 20, and at least two non-bending areas, a non-bending area 10, and a non-bending area 30, wherein, the bending area 20 and the non-bending areas 10,30 are arranged along a same direction, and the bending area 20 is positioned between the two adjacent non-bending areas 10,30; at least one support layer 102 disposed on the non-display surface of the flexible display panel 101, wherein, the support layer 102 plays a role of supporting the flexible display panel 101 and reduces stress received by the flexible display panel 101; and at least one glue layer 103 disposed between the support layer 102 and the flexible display panel 101 to bond the support layer 102 and the flexible display panel 101. Wherein, when the display device is folded, the bending area 20 is drop-shaped or U-shaped. A material of the support layer 102 includes, but is not limited to, amorphous materials or stainless steel SUS, and a thickness of the support layer 102 is within 200 micrometers. The glue layer 103 includes OCA glue layer materials.

Specifically, as shown in FIG. 1, FIG. 1 is a schematic structural diagram of the display device according to this embodiment. Referring to FIG. 1, the support layer 102 having a same size with the flexible display panel 101 is used, that is, the support layer 102 and the flexible display panel 101 have the same size, and the support layer 102 is attached to the flexible display panel 101 by the glue layer 103. As shown in the figure, in the non-bending area 10 and the non-bending area 30, the support layer 102 is completely attached to the flexible display panel 101 by the glue layer 103, and in the bending area 20, the support layer 102 is not attached to the flexible display panel 101, that is, the glue layer 103 in the bending area 20 is a hollowed-out area which is a space formed by non-adhesion between the support layer 102 and the flexible display panel 101 in the bending area 20. Using full adhesion in the non-bending area 10 and the non-bending area 30 while using non-adhesion treatment in the bending area 20 can ensure that the display device has good flatness when being unfolded and the flexible display panel 101 can receive less constraints and stresses from mechanisms.

This embodiment also provides a method of experimental design to determine a reasonable distance without the glue layer in the bending area and a theoretical formula with each influencing factor. As shown in FIGS. 2A and 2B, a shape of the bending area of the display device provided by this embodiment after bending includes at least drop-shape and U-shape. A lateral radius of the flexible display panel in the bending area after the display device being bent is measured and recorded as R1, and a longitudinal radius of the flexible display panel in the bending area after the display device being bent is measured and recorded as R2. Then a calculation formula for a spacing L (the spacing L of the hollowed-out area shown in FIG. 1) without attaching the glue layer in the bending area can be derived through a large amount of simulation data:

$$L = -1.35 + 4.85R1 + 0.193R2;$$

wherein, R1 is a lateral radius of the flexible display panel in the bending area after the display device is bent, and R2 is a longitudinal radius of the flexible display panel in the bending area after the display device is bent.

As shown in a following table, it is a table of a reasonable spacing range without the glue layer corresponding to different bending forms and different lateral radii R1 after bending.

| Type | R1 = 4 mm | R1 = 3 mm | R1 = 2 mm | R1 = 1.5 mm |
|---|---|---|---|---|
| Drop-shape | 38-44 mm | 32-40 mm | 26-30 mm | 18-22 mm |
| U-shape | 14.6-24 mm | 11.42-22 mm | 8.28-18 mm | 6.71-16 mm |

As shown in the table above, in a drop-shaped bending area after bending the display device, when the lateral radius R1 of the bending area is 4 mm, a reasonable distance without the glue layer in the bending area ranges from 38 mm to 44 mm. When the lateral radius R1 of the bending area is 3 mm, the reasonable distance without the glue layer in the bending area ranges from 32 mm to 40 mm. When the lateral radius R1 of the bending area is 2 mm, the reasonable distance without the glue layer in the bending area ranges from 26 mm to 30 mm. When the lateral radius R1 of the bending area is 1.5 mm, the reasonable distance without the glue layer in the bending area ranges from 18 mm to 22 mm. That is, the smaller the radius of the bending area is, the smaller the reasonable distance without the glue layer in the bending area is. In a U-shaped bending area after bending the display device, when the lateral radius R1 of the bending area is 4 mm, a reasonable distance without the glue layer in the bending area ranges from 14.6 mm to 24 mm. When the lateral radius R1 of the bending area is 3 mm, the reasonable distance without the glue layer in the bending area ranges from 11.42 mm to 22 mm. When the lateral radius R1 of the bending area is 2 mm, the reasonable distance without the glue layer in the bending area ranges from 8.28 mm to 18 mm. When the lateral radius R1 of the bending area is 1.5 mm, the reasonable distance without the glue layer in the bending area ranges from 6.71 mm to 16 mm. That is, different bending shapes formed in the bending area have different influences on the reasonable distance without the glue layer in the bending area. As shown in the above table, the spacing L without attaching the glue layer can be concluded according to a large number of experiments.

An embodiment of the present disclosure further provides a display device shown in FIG. 3. The display device includes: a flexible display panel 101 including a display surface, a non-display surface disposed opposite to the display surface, at least one bending area 20, and at least two non-bending areas, a non-bending area 10, and a non-bending area 30, wherein, the bending area 20 and the non-bending areas 10,30 are arranged along a same direction, and the bending area 20 is positioned between the two adjacent non-bending areas 10,30; at least one support layer 102 disposed on the non-display surface of the flexible display panel 101, wherein, the support layer 102 plays a role of supporting the flexible display panel 101 and reduces stress received by the flexible display panel 101; and at least one glue layer 103 disposed between the support layer 102 and the flexible display panel 101 to bond the support layer 102 and the flexible display panel 101. Wherein, when the display device is folded, the bending area 20 is drop-shaped or U-shaped. A material of the support layer 102 includes, but is not limited to, amorphous materials or stainless steel SUS, and a thickness of the support layer 102 is within 200 micrometers. The glue layer 103 includes OCA glue layer materials.

Specifically, the support layer 102 is a segmented design, and includes a plurality of hard support layers 1021 and a soft support layer 1022. The hard support layers 1021 are disposed in the non-bending area 10 and the non-bending area 30, and the soft support layer 1022 is disposed in the bending area 20. Wherein, a material of the hard support layers 1021 includes, but is not limited to, amorphous materials or stainless steel SUS, and the soft support layer 1022 is a soft material that is resistant to bending. The soft support layer 1022 includes, but is not limited to, silica gel or silicone rubber, and a viscosity of the soft support layer 1022 ranges from 400,000 centipoise to 700,000 centipoise. In the non-bending area 10 and the non-bending area 30, the hard support layers 1021 is attached to the flexible display panel 101 by the glue layer 103, and in the bending area 20, the soft support layer 1022 is attached to the flexible display panel 101 by the glue layer 103. Thicknesses of the soft support layer 1022 and the hard support layers are the same.

Specifically, a segmented support layer 102 is used to attach to the flexible display panel 101, which uses the hard support layers 1022 to attach to the flexible display panel 101 in the non-bending area 10 and the non-bending area 30, thereby ensuring that in an unfolded state, the display device not only has a firm feel when pressed, but also has good flatness. And in the bending area 20, using the soft support layer 1022 that is resistant to bending to attach to the bending area 20 of the flexible display panel 101 can reduce stresses from the non-bending areas and reduce the deformation of the glue layer. The soft support layer 1022 is resistant to bending and can also keep the display device in a drop-shape or a U-shape after being folded.

The display device provided by the embodiments of the present disclosure hollows out the glue layer in the bending area, that is, the support layer in the bending area is not attached to the flexible display panel, and because there is no glue layer in the bending area, when the display device is bent, the bending area is not restricted by mechanisms and can be easily bent; and when the display device is unfolded, there are no "crease" and "wave" caused by the deformation of the glue layer. In addition, the segmented support layer structure is further provided, which uses the soft support layer in the bending area. When the display device is bent, the soft support layer can reduce the stresses from the non-bending areas and the deformation of the glue layer. The soft support layer is resistant to bending and can also keep the display device in the drop-shape or the U-shape after being folded. When the display device is unfolded, the soft support layer has good flatness, thereby reducing phenomena such as "creases" and "waves". Therefore, the display device provided by the embodiment of the present disclosure can improve the flatness of the glue layer after multiple repeated folding operations and then being restored to an unfolded state, and ensures adhesion between the glue layer and a functional layer attached to the glue layer, thereby preventing the display device from having problems of degumming, "creases", and "waves".

The display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display device, comprising:
   a flexible display panel comprising a display surface, a non-display surface disposed opposite to the display surface, at least one bending area, and at least two non-bending areas, wherein the bending area and the non-bending areas are arranged along a same direction, and the bending area is positioned between two of the non-bending areas adjacent to each other;
   at least one support layer disposed on the non-display surface of the flexible display panel; and
   at least one glue layer disposed between the support layer and the flexible display panel to bond the support layer and the flexible display panel;
   wherein when the display device is folded, the bending area is drop-shaped; and
   the support layer comprises amorphous materials or stainless steel materials, and a thickness of the support layer is less than or equal to 200 micrometers;

wherein the glue layer comprises a hollowed-out area corresponding to a portion of the support layer in the bending area, the support layer is completely attached to the flexible display panel by the glue layer in the non-bending areas, and the support layer corresponding to the hollowed-out area is not attached to the flexible display panel; and wherein the hollowed-out area has a spacing L, and $L=-1.35+4.85R1+0.193R2$, where R1 is a lateral radius of the flexible display panel in the bending area after the display device is bent, and R2 is a longitudinal radius of the flexible display panel in the bending area after the display device is bent.

2. The display device according to claim 1, wherein the support layer and the flexible display panel have a same size.

3. The display device according to claim 1, wherein the support layer comprises a plurality of segments, and the support layer comprises a plurality of hard support layers and a soft support layer.

4. The display device according to claim 3, wherein in the non-bending areas, the hard support layers are attached to the flexible display panel, and in the bending area, the soft support layer is attached to the flexible display panel.

5. The display device according to claim 4, wherein the soft support layer comprises silica gel or silicone rubber, and a viscosity of the soft support layer ranges from 400,000 centipoise to 700,000 centipoise.

6. The display device according to claim 5, wherein thicknesses of the soft support layer and the hard support layers are same.

7. A display device, comprising:
a flexible display panel comprising a display surface, a non-display surface disposed opposite to the display surface, at least one bending area, and at least two non-bending areas, wherein the bending area and the non-bending areas are arranged along a same direction, and the bending area is positioned between two of the non-bending areas adjacent to each other;
at least one support layer disposed on the non-display surface of the flexible display panel; and
at least one glue layer disposed between the support layer and the flexible display panel to bond the support layer and the flexible display panel;
wherein when the display device is folded, the bending area is drop-shaped;
wherein the glue layer comprises a hollowed-out area corresponding to a portion of the support layer in the bending area, the support layer is completely attached to the flexible display panel by the glue layer in the non-bending areas, and the support layer corresponding to the hollowed-out area is not attached to the flexible display panel; and
wherein the hollowed-out area has a spacing L, and $L=-1.35+4.85R1+0.193R2$, where R1 is a lateral radius of the flexible display panel in the bending area after the display device is bent, and R2 is a longitudinal radius of the flexible display panel in the bending area after the display device is bent.

8. The display device according to claim 7, wherein the support layer comprises amorphous materials or stainless steel materials.

9. The display device according to claim 7, wherein a thickness of the support layer is less than or equal to 200 micrometers.

10. The display device according to claim 7, wherein the support layer and the flexible display panel have a same size.

11. The display device according to claim 7, wherein the support layer comprises a plurality of segments, and the support layer comprises a plurality of hard support layers and a soft support layer.

12. The display device according to claim 11, wherein in the non-bending areas, the hard support layers are attached to the flexible display panel, and in the bending area, the soft support layer is attached to the flexible display panel.

13. The display device according to claim 12, wherein the soft support layer comprises silica gel or silicone rubber, and a viscosity of the soft support layer ranges from 400,000 centipoise to 700,000 centipoise.

14. The display device according to claim 13, wherein thicknesses of the soft support layer and the hard support layers are same.

* * * * *